US010498109B1

(12) United States Patent
Tsai et al.

(10) Patent No.: US 10,498,109 B1
(45) Date of Patent: Dec. 3, 2019

(54) PROJECTOR OF STRUCTURED LIGHT PATTERN

(71) Applicant: Digigram Technology Co., Ltd., Taoyuan (TW)

(72) Inventors: Chao Hsu Tsai, Taoyuan (TW); Chiu-Lan Chu, Taoyuan (TW)

(73) Assignee: DIGIGRAM TECHNOLOGY CO., LTD., Taoyuan (TW)

( * ) Notice: Subject to any disclaimer, the term of this patent is extended or adjusted under 35 U.S.C. 154(b) by 0 days.

(21) Appl. No.: 16/222,025

(22) Filed: Dec. 17, 2018

(30) Foreign Application Priority Data

Jun. 12, 2018 (TW) .............................. 107207870 U

(51) Int. Cl.
| | |
|---|---|
| *H01S 3/00* | (2006.01) |
| *H01S 5/42* | (2006.01) |
| *H01S 5/00* | (2006.01) |
| *G02B 27/09* | (2006.01) |
| *G06T 7/521* | (2017.01) |
| *G02B 27/10* | (2006.01) |
| *G02B 27/42* | (2006.01) |

(52) U.S. Cl.
CPC .......... *H01S 5/423* (2013.01); *G02B 27/0944* (2013.01); *G02B 27/106* (2013.01); *G02B 27/1086* (2013.01); *G02B 27/4233* (2013.01); *G06T 7/521* (2017.01); *H01S 5/005* (2013.01)

(58) Field of Classification Search
CPC ......... H01S 5/423; H01S 5/005; G06T 7/521; G02B 27/0944; G02B 27/106; G02B 27/1086; G02B 27/4233
USPC ........................................................ 356/610
See application file for complete search history.

(56) References Cited

U.S. PATENT DOCUMENTS

| | | | | |
|---|---|---|---|---|
| 9,052,512 | B2 * | 6/2015 | Miyasaka | G02B 27/4266 |
| 2015/0253123 | A1 * | 9/2015 | Braker | G01B 11/002 |
| | | | | 356/610 |
| 2016/0377414 | A1 * | 12/2016 | Thuries | G01B 11/02 |
| | | | | 356/625 |
| 2019/0178635 | A1 * | 6/2019 | Ge | G01B 11/2513 |
| 2019/0273905 | A1 * | 9/2019 | Wang | H04N 13/254 |
| 2019/0273906 | A1 * | 9/2019 | Xiao | H01S 5/423 |

* cited by examiner

*Primary Examiner* — Roy M Punnoose
(74) *Attorney, Agent, or Firm* — Muncy, Geissler, Olds & Lowe, P.C.

(57) ABSTRACT

A pattern projector with multiple point light source includes a light source of multiple point source capable of providing plural laser dot light beams in a spherical wave form, a lens element and a diffractive optical element. Plural light dots are arranged to form an arrangement pattern of emitting light dots in a specific regularity. The arrangement pattern of emitting light dots is imaged and multiplied to form plural ones. The neighboring two arrangement patterns of emitting light dots are partially overlapped. Non-regularity without repeat and variety on the overlapped portions can be achieved by DOE design that may adjust different overlapping degrees and ways on the arrangement patterns of emitting light dots in a specific regularity.

17 Claims, 12 Drawing Sheets

PROJECTOR OF STRUCTURED LIGHT PATTERN

FIELD OF THE INVENTION

The present invention is related to a field of pattern generator with laser dots, and particularly related to a projector of structured light pattern with a light source of multiple point source.

BACKGROUND OF THE INVENTION

Laser dot may be duplicated by Diffractive Optical Element (DOE) to generate multiple same light dots and to be projected as a distribution pattern of light dots at a distance. The distribution pattern, like to a jigsaw, can be constituted a larger projecting pattern by piecing multitudes of them together. However, such a projecting pattern with the duplicated distribution patterns may cause error in depth estimation when it is applied to structured-light application. Accordingly, the projecting pattern with the duplicated distribution patterns needs to be improved if it would be like to apply to structured-light fields.

SUMMARY OF THE INVENTION

A projector of structured light pattern includes a light source of multiple point source that constitute an arranging pattern of emitting light dots. A projecting pattern projected by the projector of structured light pattern is of no repeatability, or is of a repeatability period larger than a width unit of the arranging pattern of emitting light dots.

A projector of structured light pattern is provided with a light source of multiple point source and a diffractive optical element (DOE). Light beams radiating from the light source of multiple point source pass through the DOE and project multiple repeated arranging patterns of emitting light dots. These repeated arranging patterns of emitting light dots may be connected in different overlapping ways to generate different irregular projecting patterns.

A projector of structured light pattern is provided with a light source of multiple point source that are arranged in regular or irregular, and one- or two-dimensional way. Such a projector of structured light pattern may generate an irregular projecting pattern of no repeatability that is beneficial to improve accuracy of depth estimation.

A projector of structured light pattern is provided with a DOE to design and generate duplicated arranging patterns of multiple emitting light dots. These duplicated arranging patterns of multiple emitting light dots are projected at different relative positions in different overlapping ways. Consequently, a projecting pattern consisted of duplicated arranging patterns of light source of multiple point source is not regular or is of no repeatability, or is of a repeatability period larger than a width unit of the arranging pattern of emitting light dots.

Accordingly, a projector of structured light pattern includes: a light source of multiple point source comprising plural emitting light dots arranged to form an arranging pattern of emitting light dots in a specific regularity; a lens element imaging the arranging pattern of emitting light dots to be projected on a target area; and a diffractive optical element duplicating the imaged arranging pattern of emitting light dots into the plural arranging patterns of emitting light dots, wherein any adjacent two of the imaged arranging patterns of emitting light dots are partially overlapped to form an overlapping zone, and by partially overlapping the arranging patterns of emitting light dots in the specific regularity, plural projected light dots within the overlapping zone are in an irregular arrangement.

Accordingly, a projector of structured light pattern includes: a light source of multiple point source comprising plural emitting light dots arranged to form an arranging pattern of emitting light dots in a specific regularity; a diffractive optical element positioned in front of the light source of multiple point source to receive plural light beams radiated from the plural emitting light dots, wherein the diffractive optical element images the arranging pattern of emitting light dots and duplicates the imaged arranging pattern of emitting light dots into the plural arranging patterns of emitting light dots, wherein any adjacent two of the imaged arranging patterns of emitting light dots are partially overlapped to form an overlapping zone, and by partially overlapping the arranging patterns of emitting light dots in the specific regularity, plural projected light dots within the overlapping zone are in an irregular arrangement.

In one example, the at least two overlapping zones of the plural arranging pattern of emitting light dots have different widths in a horizontal or/and a vertical directions, or the plural overlapping zones of the plural arranging pattern of emitting light dots have different widths in the horizontal or/and the vertical directions.

In one example, the specific regularity is a gradually increasing spacing, a gradually decreasing spacing, an interlacing of gradually increasing and decreasing spacing, or a random way in the horizontal or/and the vertical directions.

In one example, the plural emitting light dots are arranged in an arrangement direction with an angle that is between a horizontal direction or a vertical direction and the arrangement direction.

In one example, the plural emitting light dots are arranged in a concentric-circles way to form the arranging pattern of emitting light dots to be a pattern of a concentric-circles distributing dots.

In one example, the arranging pattern of emitting light dots includes at least a first and a second portions in the specific regularity; the plural emitting light dots respectively corresponding to the first and second portions are arranged in two arrangement directions with an angle between them; the diffractive optical element duplicates the first and second portions to respectively form plural close together to respectively form a first and a second combined patterns; and the first and the second combined patterns are overlapped to form a complex combined pattern.

In one example, the specific regularity is a gradually increasing spacing, a gradually decreasing spacing, an interlacing of gradually increasing and decreasing spacing, or a random way in the horizontal or/and the vertical directions.

In one example, the light source of multiple point source is provided with a vertical-cavity surface-emitting laser (VCSEL).

Figure 1:
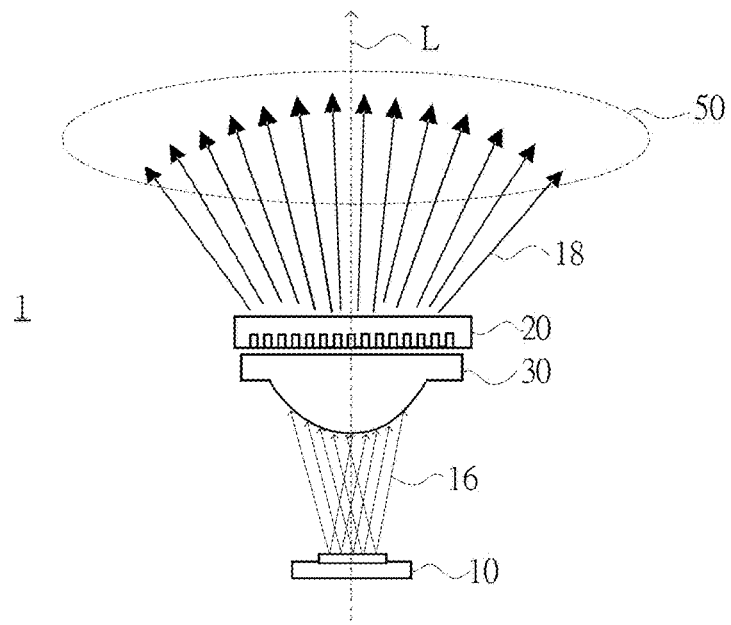
FIG. 1 is a side-view diagram illustrating first embodiment of a projector of structured light pattern with component arrangement and light radiation direction according to the present invention.

EXPLANATION OF THE CODES 1, 3, 5 projector of structured light pattern
6 distribution of projecting dots
10 light source
11, 11a, 11b, 15, 21, 21a, 21b, 21c, 21d, 31, 41, 41a, 41b, 51, 51a, 51b,
61, 71, 81, 91 arranging pattern of emitting light dots
13, 17, 23, 27a, 27b, 33, 37, 43, 53, 63, 73, 83 distribution pattern of light dots
16 laser dot light beam
18 imaging light beams
19 light-emitting side
20 diffractive optical element
25a first arranging pattern of emitting light dots
25b second arranging pattern of emitting light dots
30 lens element
31a, 31b row of emitting light dots
32 diffractive lens
50 target area
12a, 12b, 12c, 12d, 12e, 12f emitting light dot
L axis
X, Y axis)
X1, X2, X3, X4, Y1, Y2, Y3, Y4 coordinate axis
X spacing
d spacing
θ angle

DETAILED DESCRIPTION OF THE PREFERRED EMBODIMENT

A target area following mentioned in the present invention is referred to an illuminated area, which may a plate surface, a cambered surface, a curved surface, or a rough profile. Following embodiments are illustrated with one plate surface. Next, patterns, regular or non-regular dots distribution of projecting laser dots at the target area are visible to be captured by people or camera. Furthermore, there are some parts or components to be enlarged in different ratios in drawings for illustration, which do not limit spirits of the present invention.

A light source of multiple point source following mentioned includes multiple emitting laser dots to radiate multiple laser dot light beams Generally, each laser dot light beam is radiated in spherical wave, and all of the laser dot light beams are radiated in normal directions with respect to a same light-emitting surface. So the multiple laser dot light beams of spherical or plane waves in the present invention are parallel to each another but not overlapped. It is understood that laser is light with divergence angle, so multiple laser dot light beams from the same light-emitting surface are intersecting between the light-emitting surface and the DOE. In practice, a Vertical Cavity Surface Emitting Laser (VCSEL) generally provide a laser dot light beam, and multiple laser dot light beams may be provided by making plural holes arrangement on VCSEL, as well as the number, sizes and positions of the holes. Besides, dot light beams radiated from holes on VCSEL may be generated by modulating and building true distribution model of wave-front for little area light source. Thus, so-called emitting light dots in following paragraphs include emitting light of small area, too. Compared with a receiving surface of DOE for receiving plural laser dot light beams, the size of one hole on VCSEL is about few micrometers or few tens micrometers, and the size of the receiving surface of DOE is in the order of one by one square millimeters.

FIG. 1 is a side-view diagram illustrating first embodiment of a projector of structured light pattern with component arrangement and light radiation direction according to the present invention. A projector of structured light pattern 1 includes a light source 10, a lens element 30 and a diffractive optical element 20. The lens element 30 and the diffractive optical element 20 are arranged in spacing, and both of them are positioned on a path that plural light beams in a spherical wave form radiate from the light source 10. The spacing between the lens element 30 and the diffractive optical element 20 may be small to make the lens element 30 and the diffractive optical element 20 close to each other. For convenience, the light source 10, lens element 30, the diffractive optical element 20 and a target area 50 are positioned in spacing on an axis "L". In the first embodiment, the light source 10 includes plural emitting light dots to radiate plural laser dot light beams 16 in the spherical wave. The plural emitting light dots on the light source 10 are arranged to form an arranging pattern of emitting light dots in a specific regularity. Next, the lens element 30 may image the arranging pattern of emitting light dots to be projected far away. The diffractive optical element 20 duplicates the imaged arranging pattern of emitting light dots into the plural arranging patterns of emitting light dots. Accordingly aforementioned, imaging light beams 18 are projected on the target area 50 to form a distribution pattern of light dots that is consisted of the plural arranging pattern of emitting light dots. The arrangements of the arranging pattern of emitting light dots and the ones are mentioned as follows.

Figure 2:
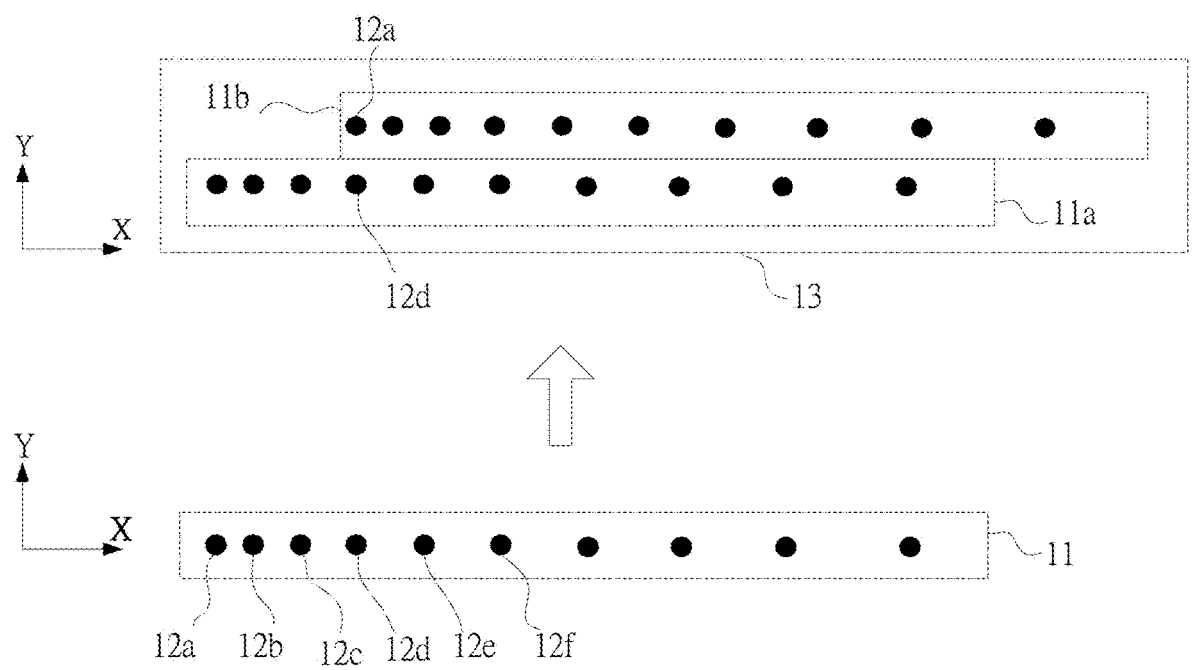
FIG. 2 is a front-view diagram illustrating partial light dots on a distribution pattern of light dots projected by a projector of structured light pattern with an arrangement of the light source of multiple point source of first embodiment according to the present invention.

FIG. 2 is a front-view diagram illustrating partial light dots on a distribution pattern of light dots projected by a projector of structured light pattern with an arrangement of the light source of multiple point source of first embodiment according to the present invention. Referring to FIG. 1 and FIG. 2, the light source 10 includes the plural emitting light dots, and each of them radiates a laser dot light beam in the specific regularity. These laser dot light beams constitute the plural laser dot light beams 16 in the spherical wave. A light-emitting side of the light source 10 may be implemented by plural laser openings of a vertical-cavity surface-emitting laser. Next, in FIG. 2, the plural emitting light dots are arranged in a specific regularity such as arithmetic progression spacing. For example, emitting light dots 12a, 12b, 12c, 12d, 12e and 12f are sequentially arranged, a spacing unit between the adjacent emitting light dots 12a, 12b is defined as "x"; then spacing between the emitting light dots 12b, 12c is "x" added with "d" ("x+d"); spacing between the emitting light dots 12c, 12d is "x" added with multiplying 2 by "d" ("x+2d"); spacing between the emitting light dots 12d, 12e is "x" added with multiplying 3 by "d" ("x+3d"); and spacing between the emitting light dots 12e, 12f is "x" added with multiplying 4 by "d" ("x+4d"), and so on. Consequently, the arranging pattern of emitting light dots 11 in FIG. 2 is an arrangement of arithmetic progression spacing. Furthermore, "x" and "d" are values larger than 0. The difference in spacing between any adjacent two emitting light dots is not limited to integer times of "d". It is also understood that the values aforementioned are described with respect to the emitting light dot at the most left position on FIG. 2. Alternatively, the emitting light dot at any position may be as a benchmark, and the values of "x" and "d" may be smaller than 0, instead of positive numbers.

Referring to FIG. 1 and FIG. 2 again, after the plural emitting light dots are imaged and duplicated by the lens element 30 and the diffractive optical element 20, a distribution pattern of light dots constituted by the plural arranging patterns of emitting light dots 11a, 11b is projected on the target area 50. The arranging pattern of emitting light dots 11a, 11b respectively include the plural emitting light dots 12a, 12b, 12c, 12d, 12e and 12f, and so on. Moreover, the arranging patterns of emitting light dots 11a, 11b are adjacent and partially overlapped. In FIG. 2, the arranging patterns of emitting light dots 11a, 11b are abutting in Y axis direction and partially overlapped in X axis. Furthermore, the emitting light dot 12d of the arranging pattern of emitting light dots 11a is aligned the emitting light dot 12a of the arranging pattern of emitting light dots 11b. It is understood that how to overlap in one dimension (X axis) is not limited to the one in FIG. 2. The emitting light dot 12a of the arranging pattern of emitting light dots 11b is aligned another one of emitting light dots of the arranging pattern of emitting light dots 11a. It is emphasized that the emitting light dot 12a of the arranging pattern of emitting light dots 11b is not aligned emitting light dot 12a of the arranging pattern of emitting light dots 11a, so as to form the relatively irregular distribution pattern of light dots 13 on the target area 50. Moreover, under considering the formation of a distribution pattern of light dots with relatively large randomness, the emitting dots of the arranging patterns of emitting light dots 11a, 11b are not rightly aligned, or are partially overlapped in Y axis with different overlapping degrees, or are biased in Y axis. Consequently, the random degree of the distribution pattern of light dots 13 may be enhanced.

Figure 3:
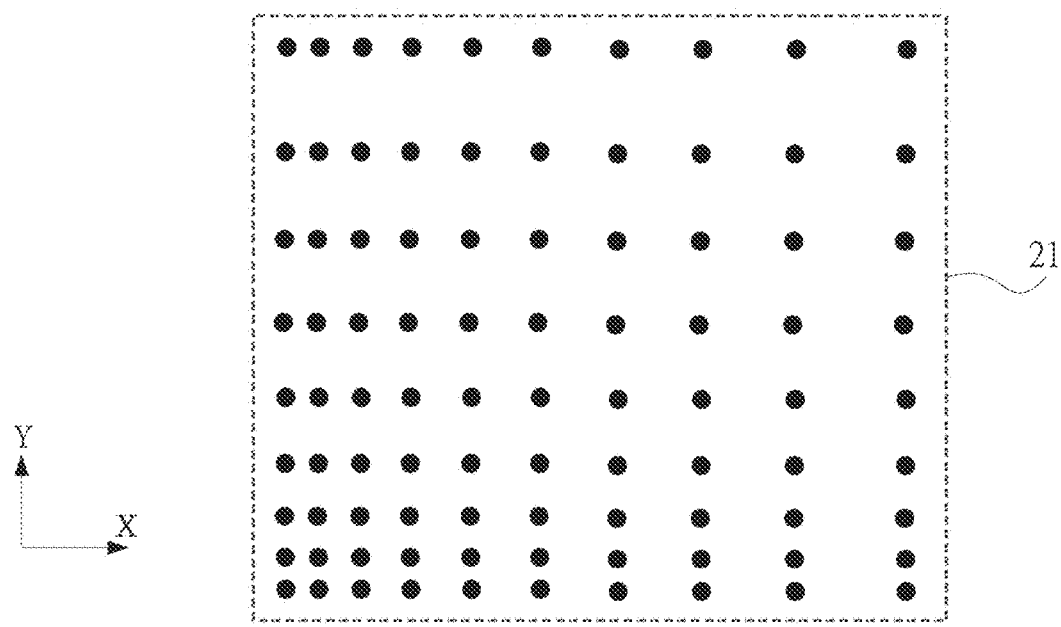
FIG. 3 is a front-view diagram illustrating an arranging pattern of emitting light dots of second embodiment for a projector of structured light pattern according to the present invention.
Figure 4:
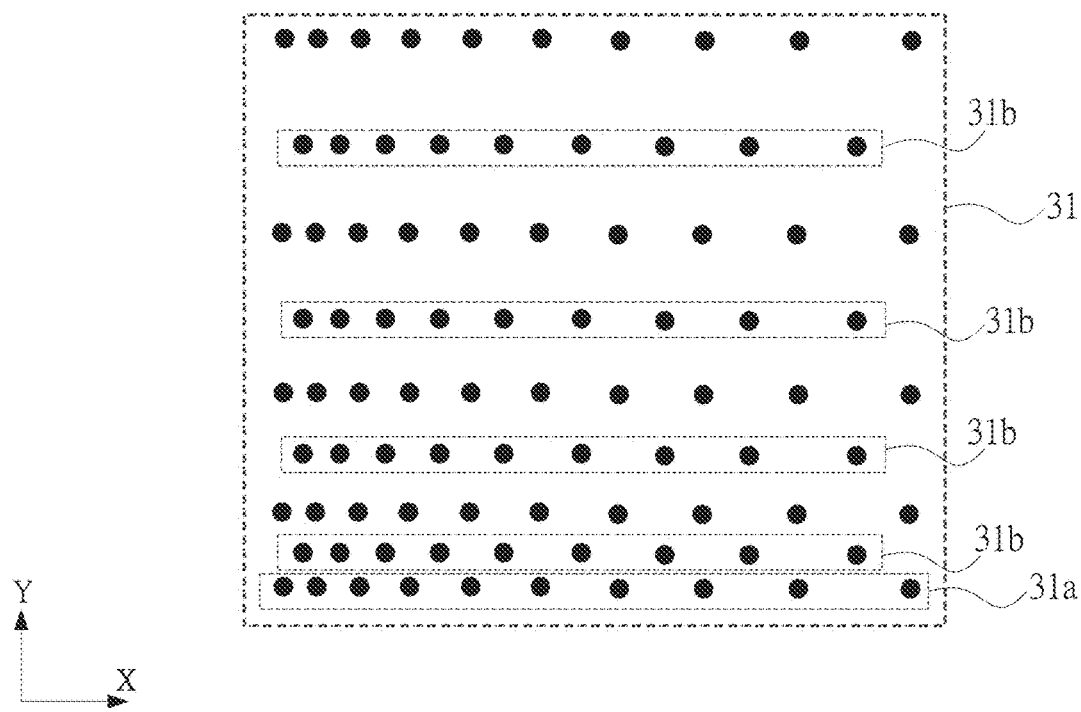
FIG. 4 is a front-view diagram illustrating an arranging pattern of emitting light dots of third embodiment for a projector of structured light pattern according to the present invention.

FIG. 3 and FIG. 4 are front-view diagram respectively illustrating an arranging pattern of emitting light dots of second and third embodiments for a projector of structured light pattern according to the present invention. Shown in FIG. 3, a row of emitting light dots in X axis of FIG. 2 is expanded to form an arranging pattern of emitting light dots 21 with a two-dimension array of FIG. 3. In FIG. 3, the emitting light dot at the most left bottom position is a benchmark, and the other ones are arranged in gradually increasing spacing way in X axis and Y axis, or called to be arranged in arithmetic progression way. Accordingly, the rows of emitting light dots in two directions vertical to each other form the two-dimension array in FIG. 3, but it is not limited to in the present invention. In FIG. 4, two rows of emitting light dots 31a, 31b are interlaced to form the arranging pattern of emitting light dots 31 in zigzag effects.

Figure 5:
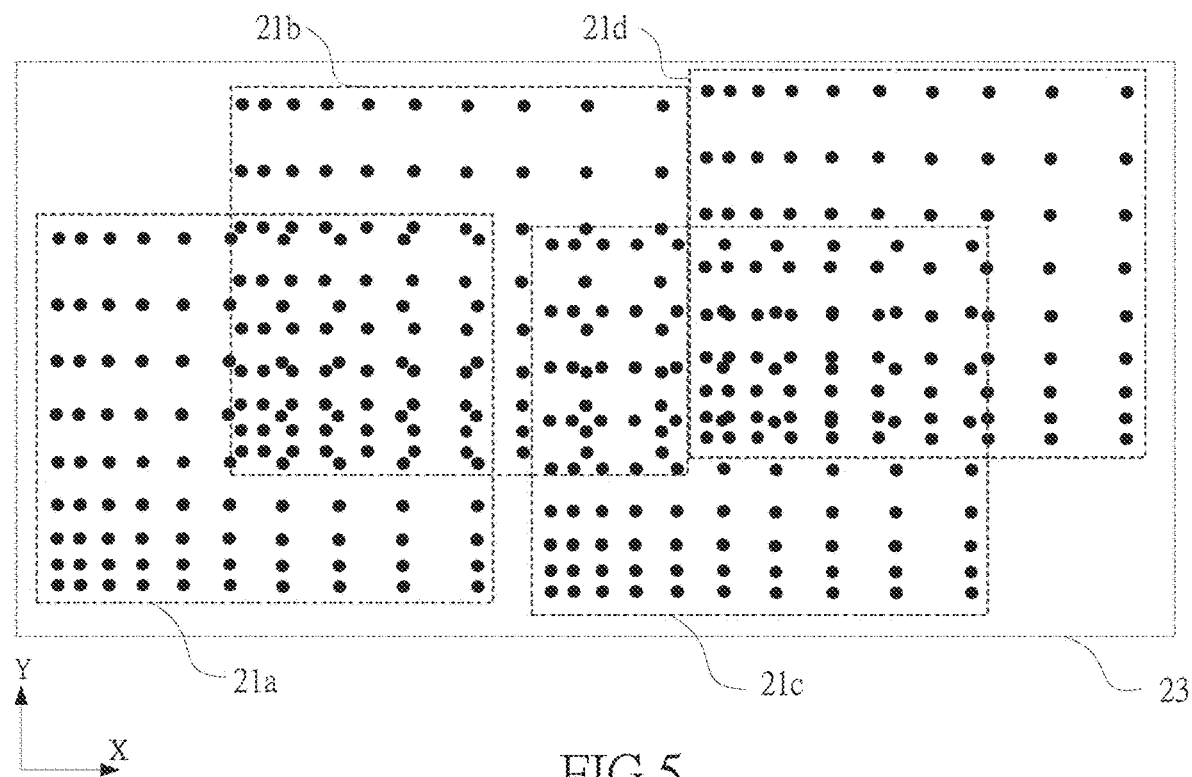
FIG. 5 is a front-view diagram illustrating partial distribution pattern of light dots of first embodiment by a light source with the arrangement pattern of emitting light dots of FIG. 3 for a projector of structured light pattern according to the present invention.

FIG. 5 is a front-view diagram illustrating partial distribution pattern of light dots of first embodiment by a light source with the arrangement pattern of emitting light dots of FIG. 3 for a projector of structured light pattern. Referring to FIG. 3 and FIG. 5, a portion of the distribution pattern of light dots 23 includes arranging patterns of emitting light dots 21a, 21b, 21c and 21d, and any adjacent two of the arranging patterns of emitting light dots are partially overlapped in X axis and Y axis (horizontal direction and vertical direction). Next, plural overlapping zone among the plural arranging patterns of emitting light dots may be different. For example, in FIG. 5, the overlapping zone formed by the arranging pattern of emitting light dots 21a and the arranging pattern of emitting light dots 21b has a length and a width different from the one formed by the arranging pattern of emitting light dots 21b and the arranging pattern of emitting light dots 21c. Similarly, the overlapping zone formed by the arranging pattern of emitting light dots 21b and the arranging pattern of emitting light dots 21c has a length and a width different from the one formed by the arranging pattern of emitting light dots 21c and the arranging pattern of emitting light dots 21d, and the like. In addition to different lengths and widths for the plural overlapping zones, the distribution pattern of light dots within each of the overlapping zone may be different. Thus, the light dots are not distributed as repeated blocks within the distribution pattern of light dots 23, and it is also said that dots distribution within the distribution pattern of light dots 23 does not have repeatability. Such a distribution pattern of light dots is suitable to apply to fields of depth estimation. It is understood that other portions of the arranging patterns of emitting light dots 21a, 21b, 21c and 21d may be adjacent to the another arranging patterns of emitting light dots and be formed different overlapping zones, but they are not shown in FIGS.

Figure 6:
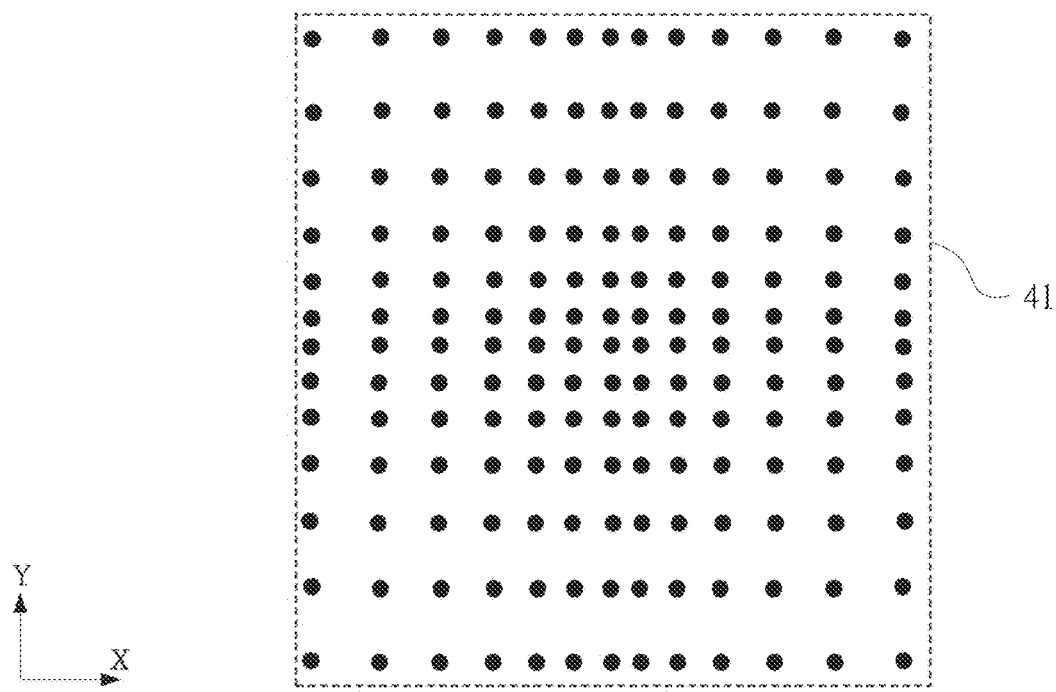
FIG. 6 is a front-view diagram illustrating an arranging pattern of emitting light dots of fourth embodiment for a projector of structured light pattern according to the present invention.
Figure 7:
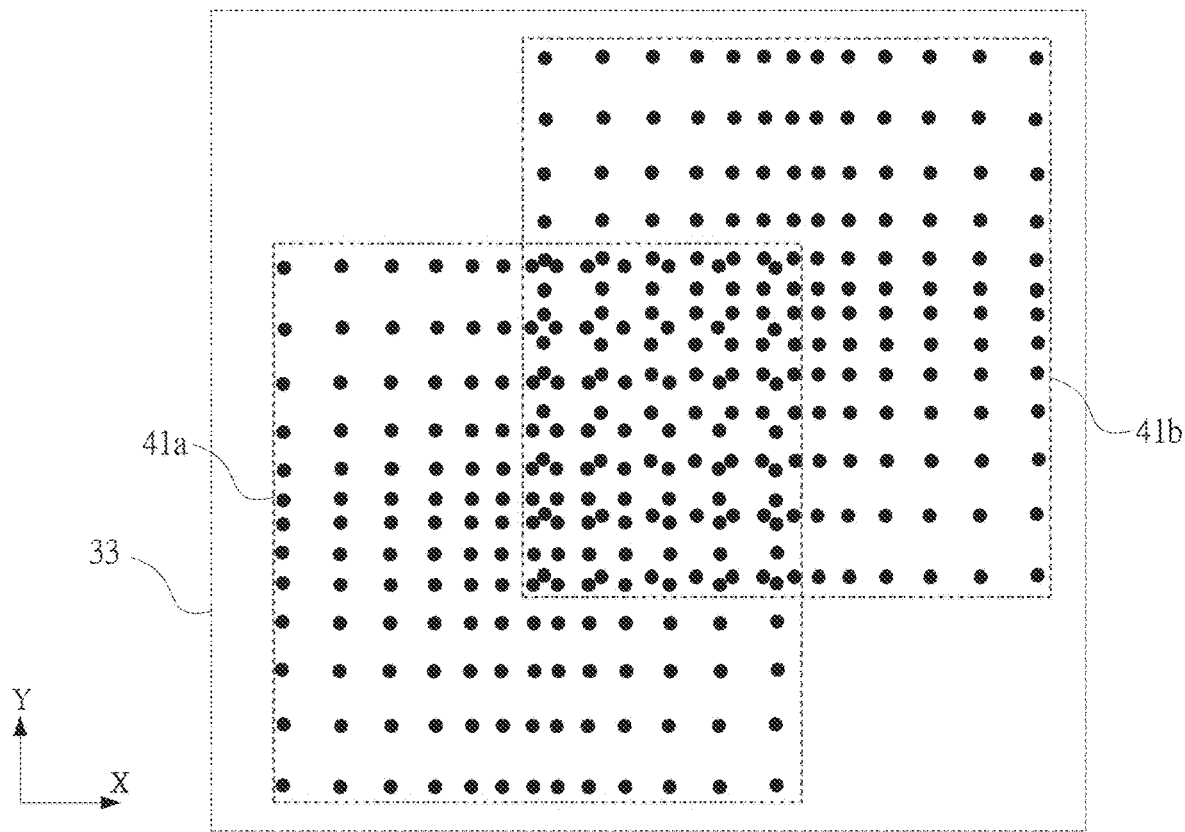
FIG. 7 is a front-view diagram illustrating partial distribution pattern of light dots of second embodiment by a light source with the arrangement pattern of emitting light dots of FIG. 6 for a projector of structured light pattern according to the present invention.

FIG. 6 is a front-view diagram illustrating an arranging pattern of emitting light dots of fourth embodiment for a projector of structured light pattern. Similar to FIG. 3, the emitting light dot at the most left bottom position is a benchmark in FIG. 6, and the other ones are arranged in one way that is gradually decreasing spacing first and then gradually increasing spacing in X axis and Y axis, respectively. It is also called that light dots in the arranging pattern of emitting light dots 41 are respectively arranged in arithmetic progression ways with respect to a center of arranging pattern of emitting light dots 41, in X axis and Y axis. It is understood that the arranging pattern of emitting light dots 41 may be similar to the interlacing arrangement in FIG. 4 but not repeated herein. FIG. 7 is a front-view diagram illustrating partial distribution pattern of light dots of second embodiment by a light source with the arrangement pattern of emitting light dots of FIG. 6 for a projector of structured light pattern. Referring to FIG. 6 and FIG. 7, a portion of the distribution pattern of light dots 33 is formed by partially overlapping the arranging pattern of emitting light dots 41a and the arranging pattern of emitting light dots 41b in two directions, so as to form irregular dots distribution.

Figure 8:
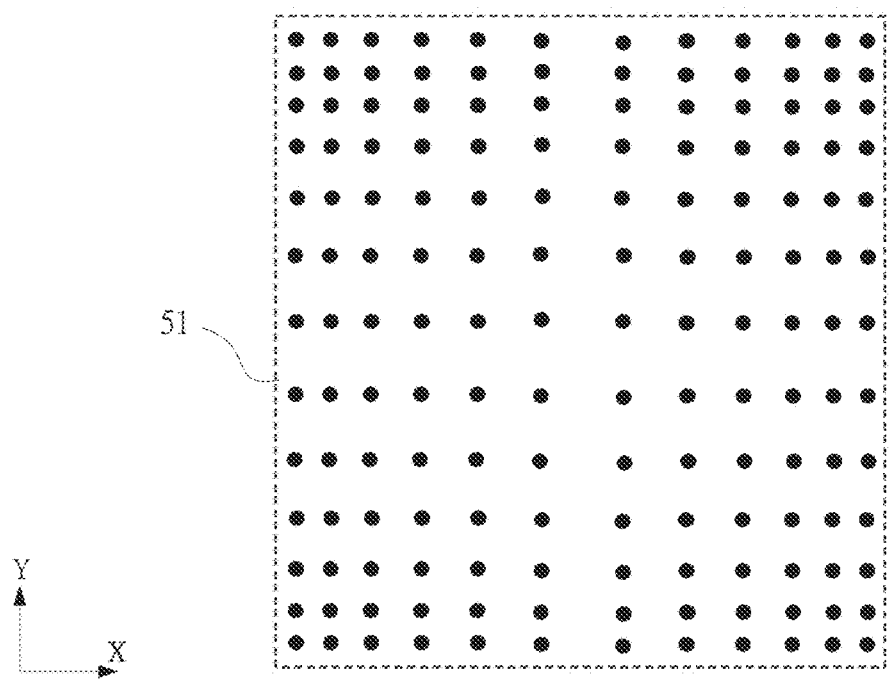
FIG. 8 is a front-view diagram illustrating an arranging pattern of emitting light dots of fifth embodiment for a projector of structured light pattern according to the present invention.
Figure 9:
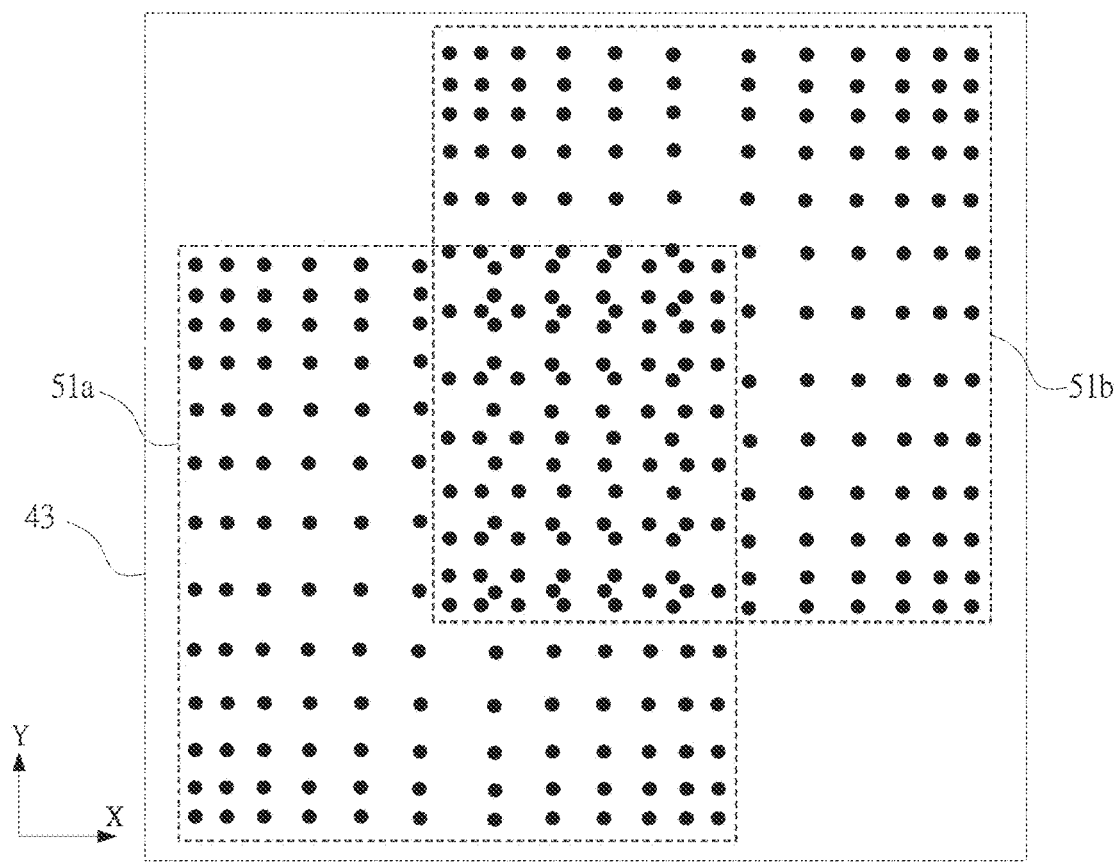
FIG. 9 is a front-view diagram illustrating partial distribution pattern of light dots of third embodiment by a light source with the arrangement pattern of emitting light dots of FIG. 8 for a projector of structured light pattern according to the present invention.

FIG. 8 is a front-view diagram illustrating an arranging pattern of emitting light dots of fifth embodiment for a projector of structured light pattern, and FIG. 9 is a front-view diagram illustrating partial distribution pattern of light dots of third embodiment by a light source with the arrangement pattern of emitting light dots of FIG. 8 for a projector of structured light pattern. Referring to FIG. 8 and FIG. 9, the emitting light dot at the most left bottom position is a benchmark in FIG. 8, and the other ones are arranged in one way that is gradually increasing spacing first and then gradually decreasing spacing in X axis and Y axis, respectively, so as to form arranging pattern of emitting light dots 51. The arranging pattern of emitting light dots 51 is imaged and duplicated to be projected as a distribution pattern of light dots 43. A portion of the distribution pattern of light dots 43 is formed by partially overlapping the arranging pattern of emitting light dots 51a and the arranging pattern of emitting light dots 51b in two directions, so as to form irregular dots distribution.

Figure 10:
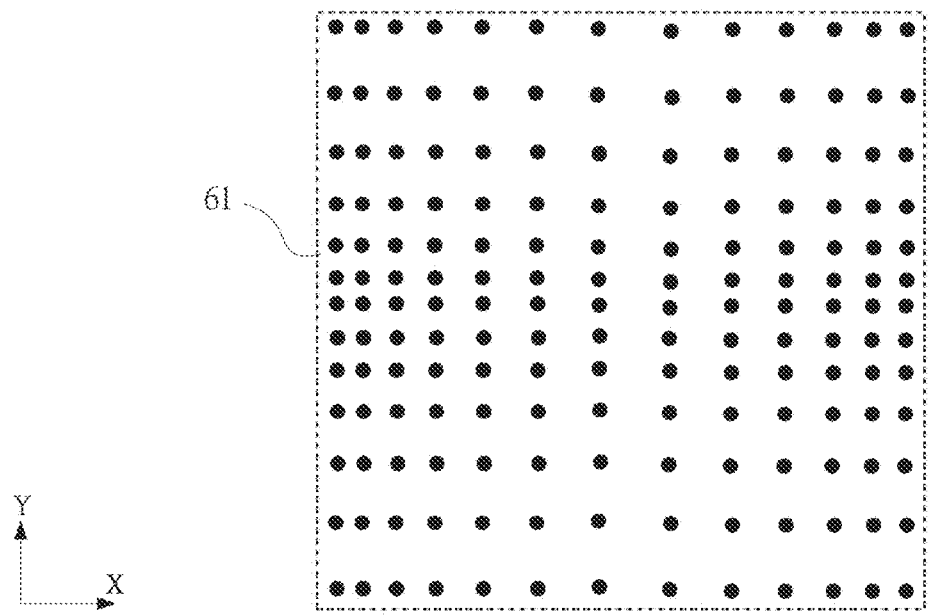
FIG. 10 is a front-view diagram illustrating an arranging pattern of emitting light dots of sixth embodiment for a projector of structured light pattern according to the present invention.
Figure 11:
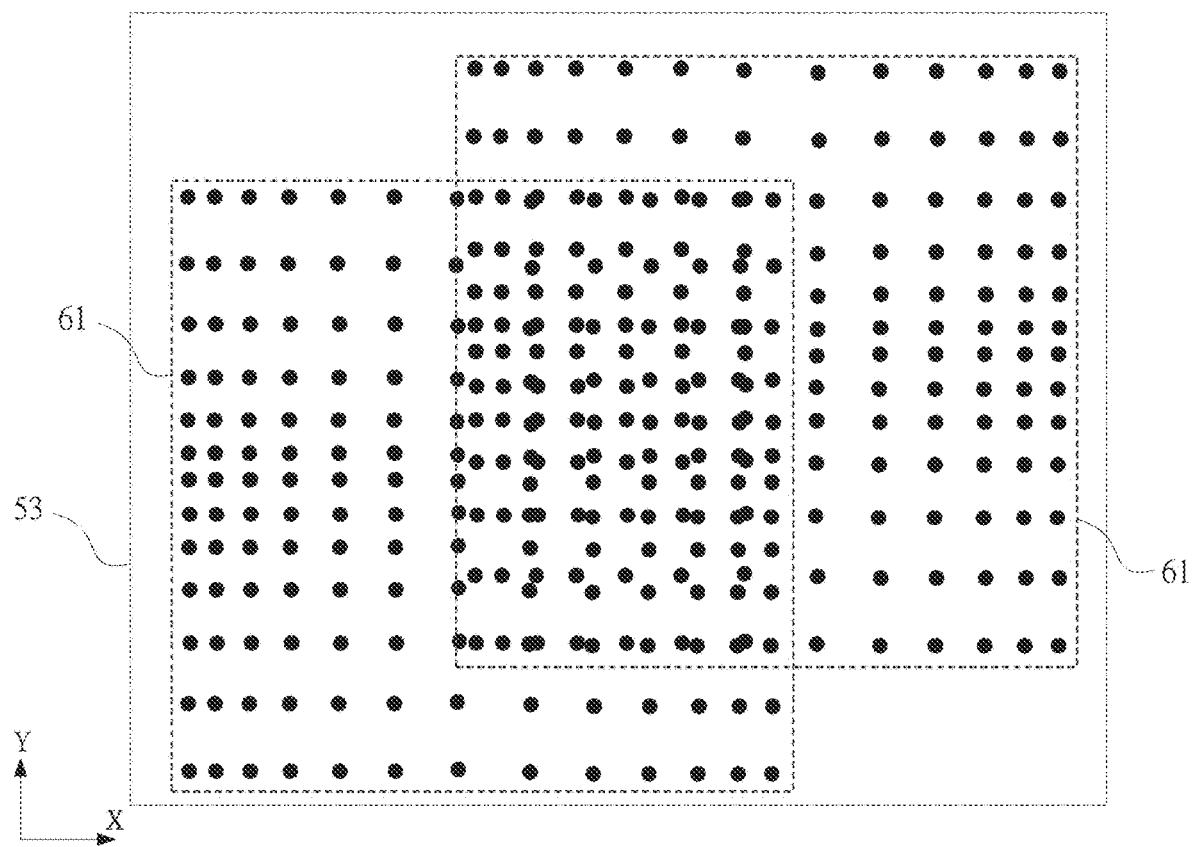
FIG. 11 is a front-view diagram illustrating partial distribution pattern of light dots of fourth embodiment by a light source with the arrangement pattern of emitting light dots of FIG. 10 for a projector of structured light pattern according to the present invention.

FIG. 10 is a front-view diagram illustrating an arranging pattern of emitting light dots of sixth embodiment for a projector of structured light pattern, and FIG. 11 is a front-view diagram illustrating partial distribution pattern of light dots of fourth embodiment by a light source with the arrangement pattern of emitting light dots of FIG. 10 for a projector of structured light pattern. Referring to FIG. 10 and FIG. 11, the emitting light dot at the most left bottom position is a benchmark in FIG. 10. The emitting light dots in X axis of arranging pattern of emitting light dots 61 are arranged in the specific regularity of gradually increasing spacing followed by gradually decreasing spacing. And next, the emitting light dots in Y axis of arranging pattern of emitting light dots 61 are arranged in the specific regularity of gradually decreasing spacing followed by gradually increasing spacing. A portion of the distribution pattern of light dots 53 is formed by partially overlapping the two adjacent arranging patterns of emitting light dots 61 in two directions.

Figure 12:
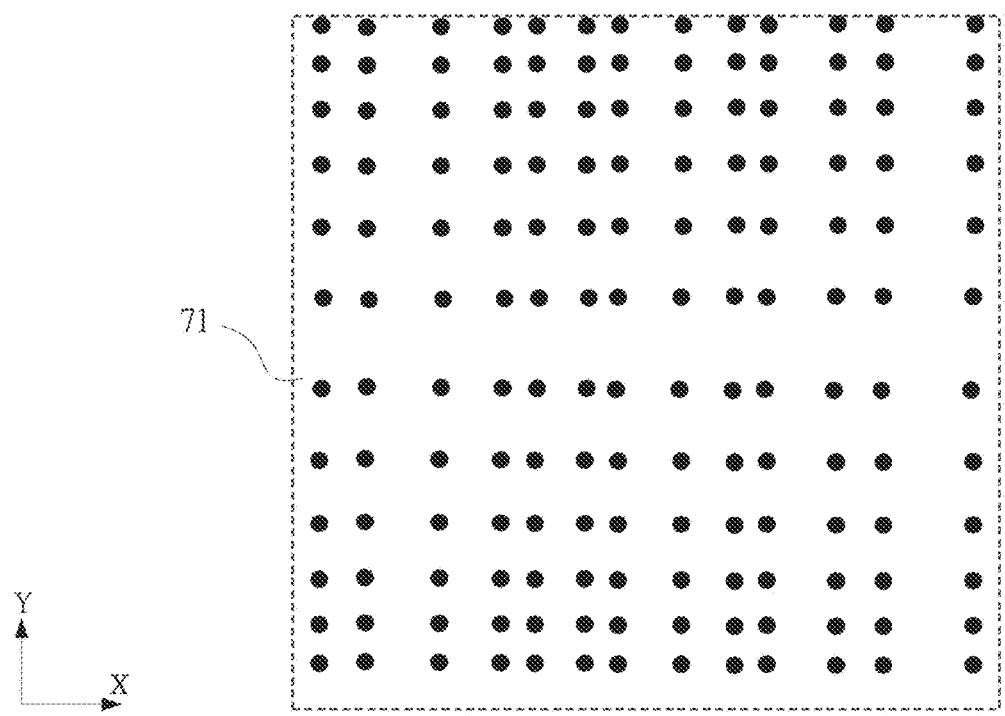
FIG. 12 is a front-view diagram illustrating an arranging pattern of emitting light dots of seventh embodiment for a projector of structured light pattern according to the present invention.
Figure 13:
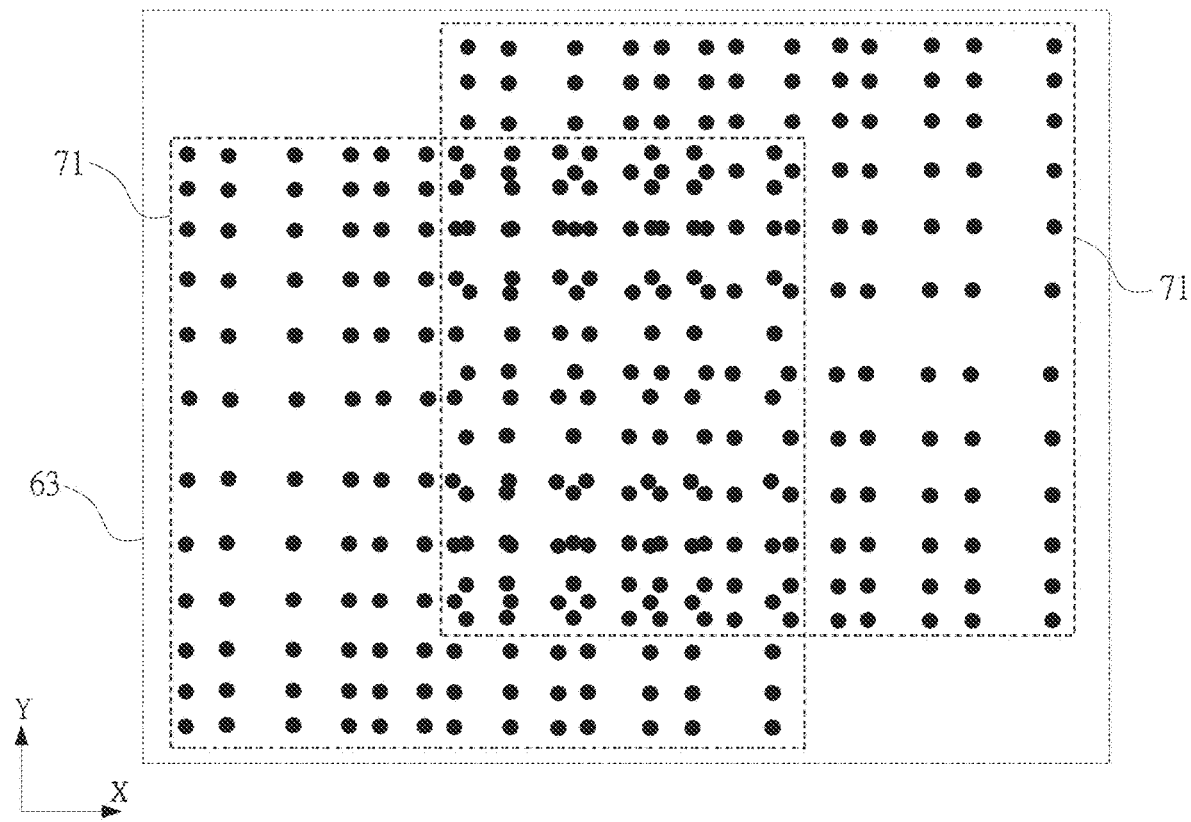
FIG. 13 is a front-view diagram illustrating partial distribution pattern of light dots of fifth embodiment by a light source with the arrangement pattern of emitting light dots of FIG. 12 for a projector of structured light pattern according to the present invention.

FIG. 12 is a front-view diagram illustrating an arranging pattern of emitting light dots of seventh embodiment for a projector of structured light pattern, and FIG. 13 is a front-view diagram illustrating partial distribution pattern of light dots of fifth embodiment by a light source with the arrangement pattern of emitting light dots of FIG. 12 for a projector of structured light pattern. Referring to FIG. 12 and FIG. 13, The emitting light dots in X axis of arranging pattern of emitting light dots 71 are arranged in the specific regularity of random spacing. And next, the emitting light dots in Y axis of arranging pattern of emitting light dots 71 are arranged in the specific regularity of gradually increasing spacing followed by gradually decreasing spacing. A portion of the distribution pattern of light dots 63 is formed by partially overlapping the two adjacent arranging patterns of emitting light dots 71 in two directions.

In the embodiments aforementioned, the arranging pattern of emitting light dots may have one kind of variation arrangement by gradually increasing or decreasing spacing in one or two dimensions, or have two kinds of variation arrangement by gradually and interlacing increasing and decreasing spacing, but it is not limited in the present invention. In application, there are multiple kinds of variation arrangement if the amount of emitting light dots is more enough. Next, so-called specific regularity for the arrangement of emitting light dots may be equal spacing, gradually increasing spacing, gradually decreasing spacing, interlacing of gradually increasing and decreasing spacing, or radon spacing. Such a specific regularity may apply to one or two dimensions. Furthermore, the plural emitting light dots for a light source may represent same or different specific regularities in different dimensions, as well as ones in a third dimension.

Figure 14:
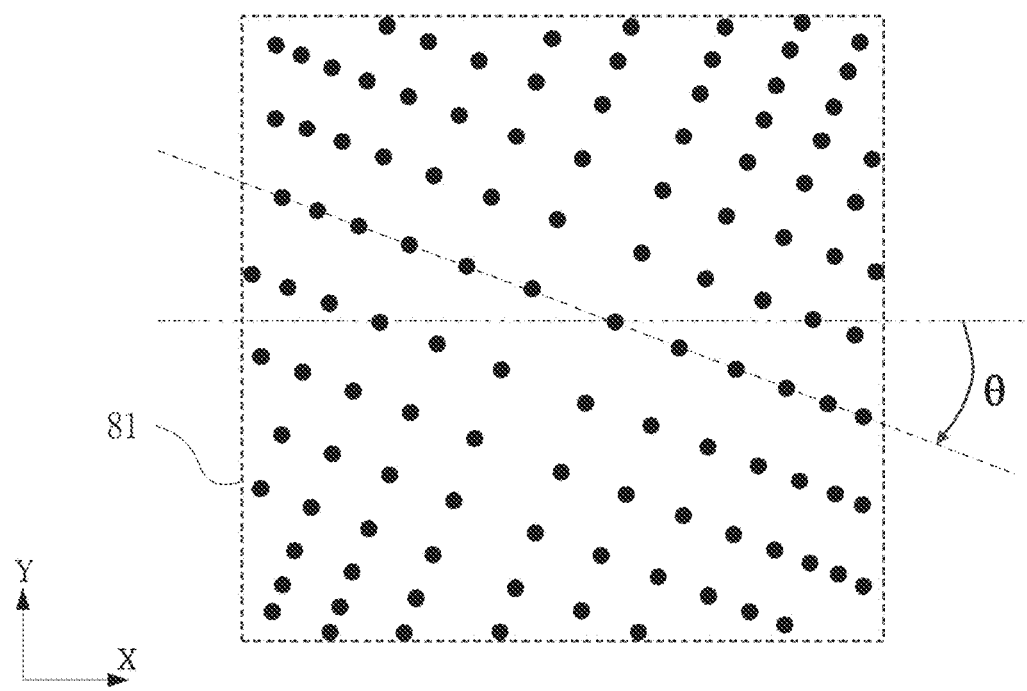
FIG. 14 is a front-view diagram illustrating an arranging pattern of emitting light dots of eighth embodiment for a projector of structured light pattern according to the present invention.
Figure 15:
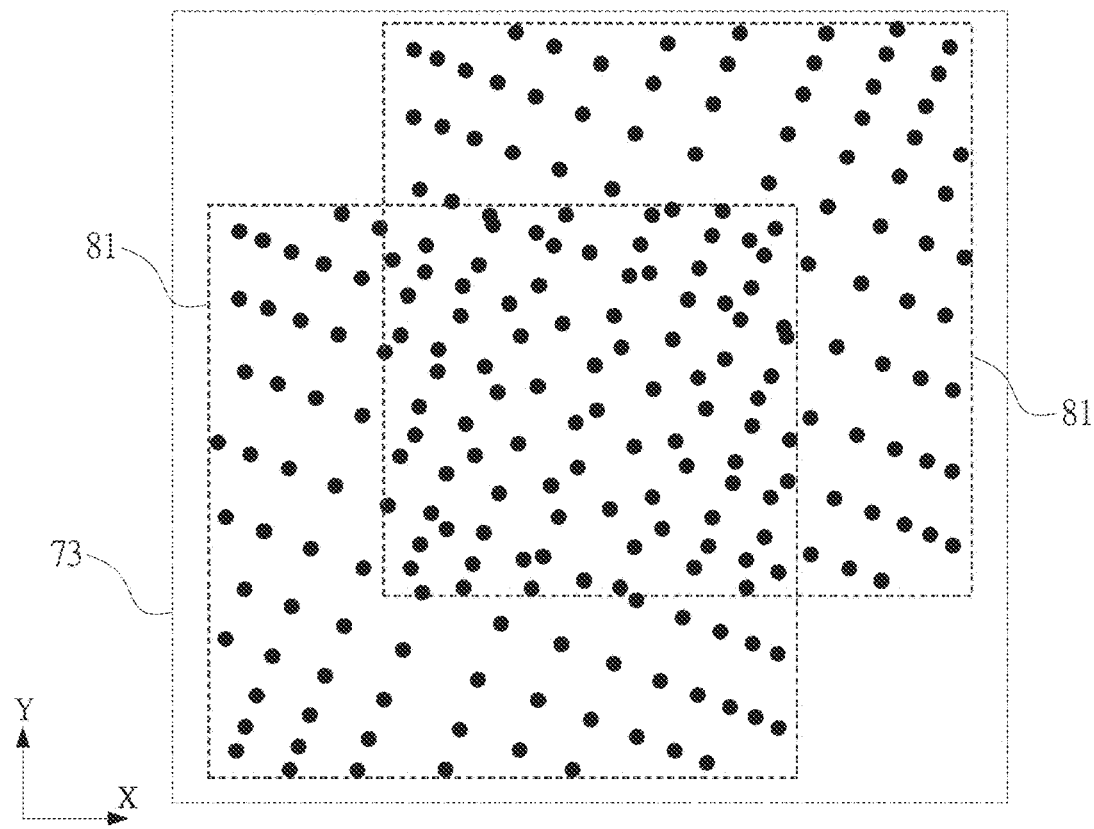
FIG. 15 is a front-view diagram illustrating partial distribution pattern of light dots of sixth embodiment by a light source with the arrangement pattern of emitting light dots of FIG. 14 for a projector of structured light pattern according to the present invention.

FIG. 14 is a front-view diagram illustrating an arranging pattern of emitting light dots of eighth embodiment for a projector of structured light pattern, and FIG. 15 is a front-view diagram illustrating partial distribution pattern of light dots of sixth embodiment by a light source with the arrangement pattern of emitting light dots of FIG. 14 for a projector of structured light pattern. Referring to FIG. 14 and FIG. 15, an arranging pattern of emitting light dots 81 represents the specific regularity of gradually increasing spacing followed by gradually decreasing spacing in two axes directions. However, the two axes for the arranging pattern of emitting light dots 81 are rotated an angel θ with respect to X axis. A portion of the distribution pattern of light dots 73 is formed by partially overlapping the two adjacent arranging patterns of emitting light dots 81 in two directions.

Figure 16:
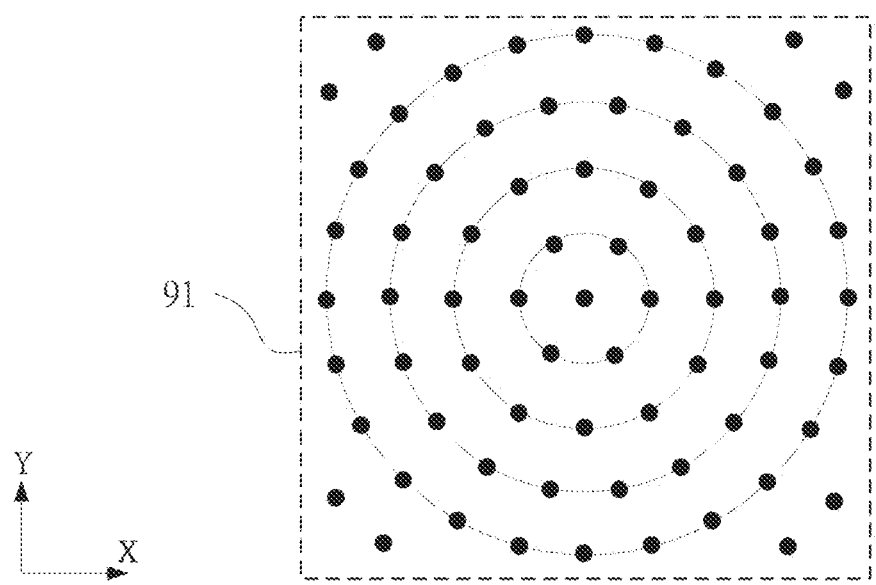
FIG. 16 is a front-view diagram illustrating an arranging pattern of emitting light dots of ninth embodiment for a projector of structured light pattern according to the present invention.
Figure 17:
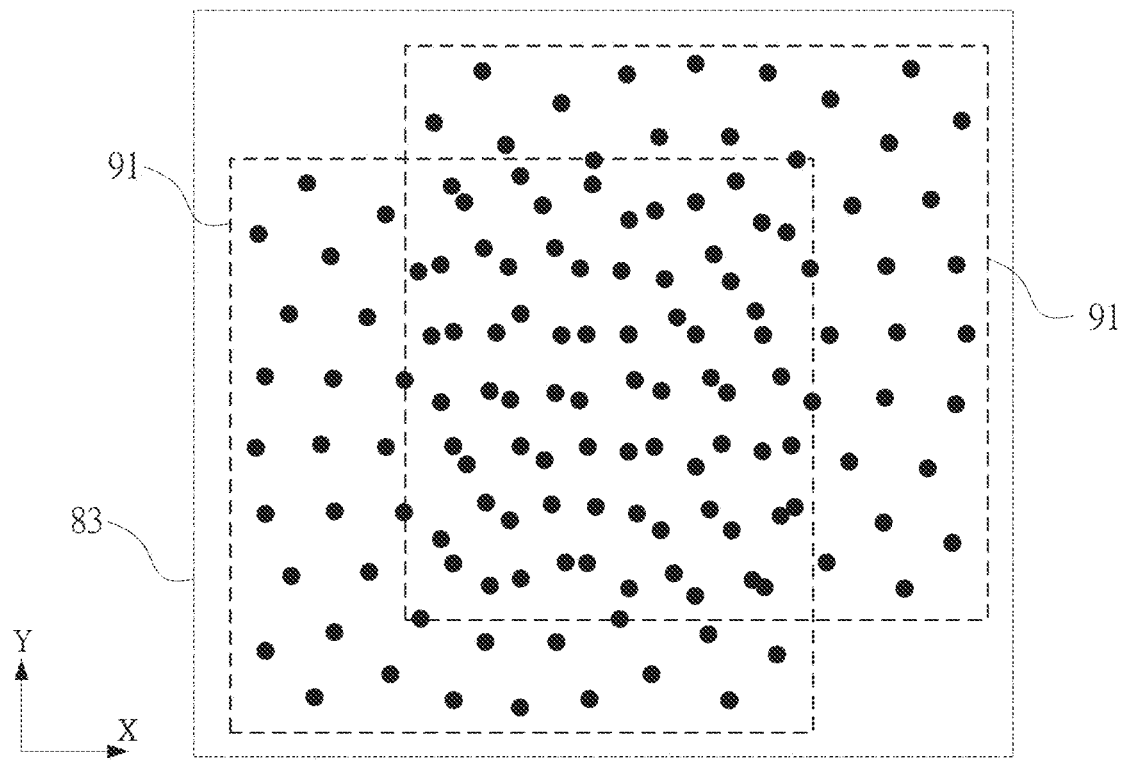
FIG. 17 is a front-view diagram illustrating partial distribution pattern of light dots of seventh embodiment by a light source with the arrangement pattern of emitting light dots of FIG. 16 for a projector of structured light pattern according to the present invention.

FIG. 16 is a front-view diagram illustrating an arranging pattern of emitting light dots of ninth embodiment for a projector of structured light pattern, and FIG. 17 is a front-view diagram illustrating partial distribution pattern of light dots of seventh embodiment by a light source with the arrangement pattern of emitting light dots of FIG. 16 for a projector of structured light pattern. Referring to FIG. 16 and FIG. 17, an arranging pattern of emitting light dots 91 has a benchmark that is a geometric center of the light-emitting side of the light source. The emitting light dots in the arranging pattern of emitting light dots 91 are arranged in the specific regularity of evenly spacing concentric-circles way. A portion of the distribution pattern of light dots 83 is formed by partially overlapping the two adjacent arranging patterns of emitting light dots 91 in two directions.

Figure 18:
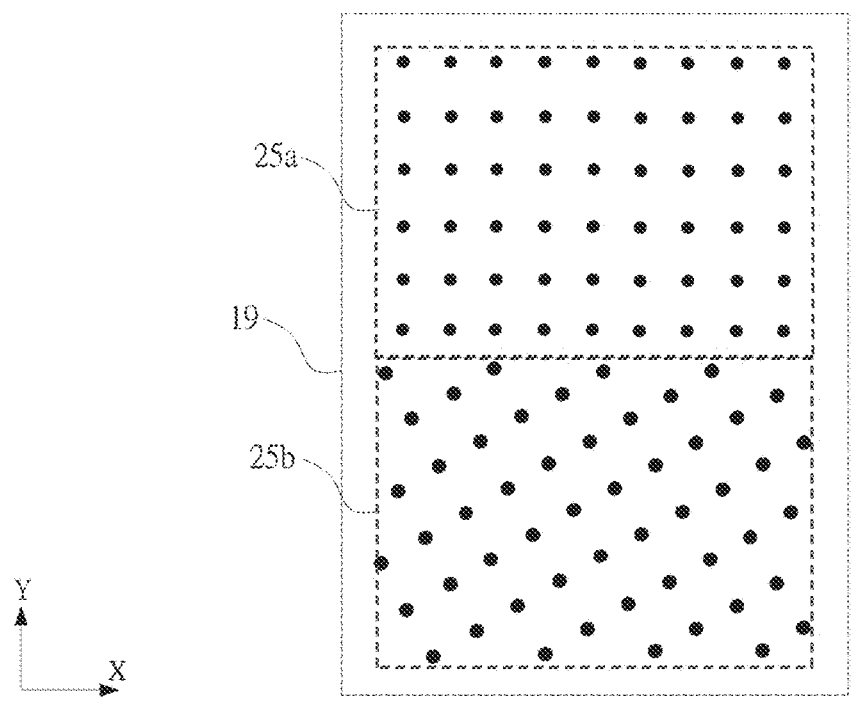
FIG. 18 is a front-view diagram illustrating an arranging pattern of emitting light dots of tenth embodiment for a projector of structured light pattern according to the present invention.
Figure 19:
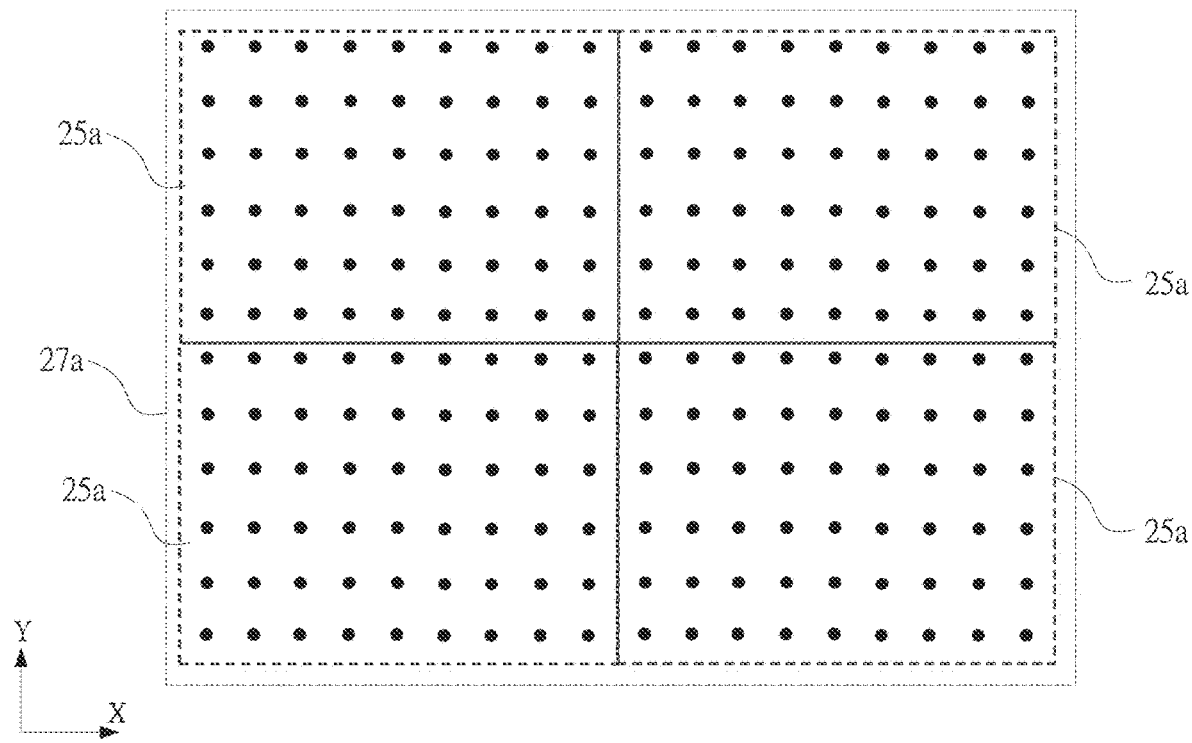
FIG. 19 is a top-view diagram illustrating partial distribution pattern of light dots by a light source with the arrangement pattern of emitting light dots of first part on FIG. 18 for a projector of structured light pattern according to the present invention.
Figure 20:
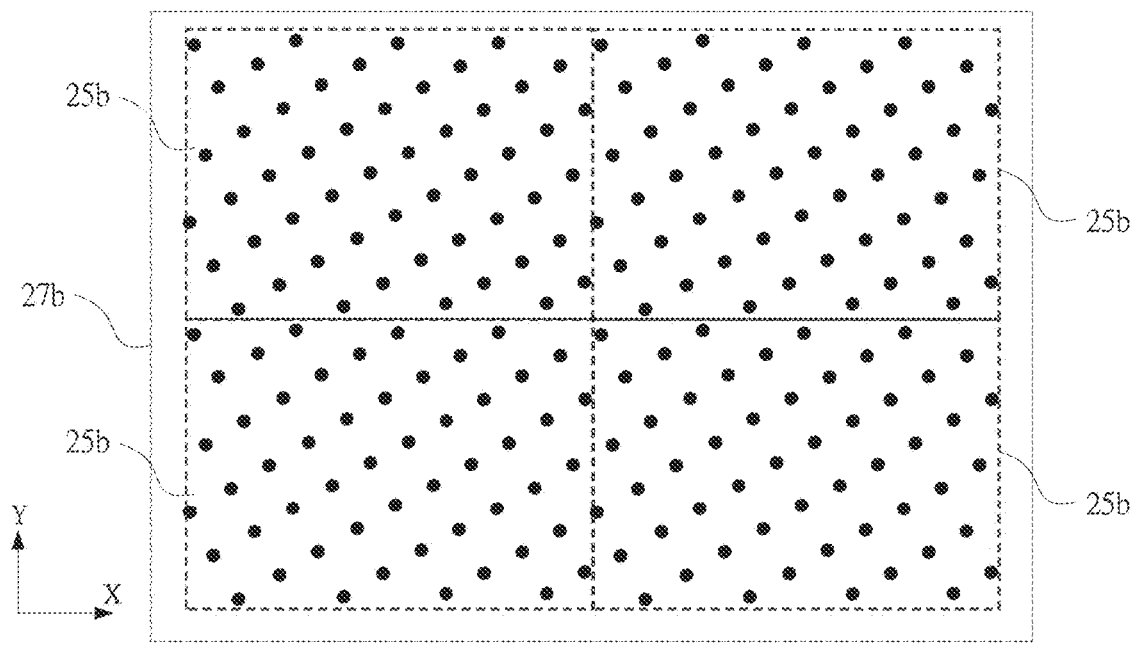
FIG. 20 is a top-view diagram illustrating partial distribution pattern of light dots by a light source with the arrangement pattern of emitting light dots of second part on FIG. 18 for a projector of structured light pattern according to the present invention.
Figure 21:
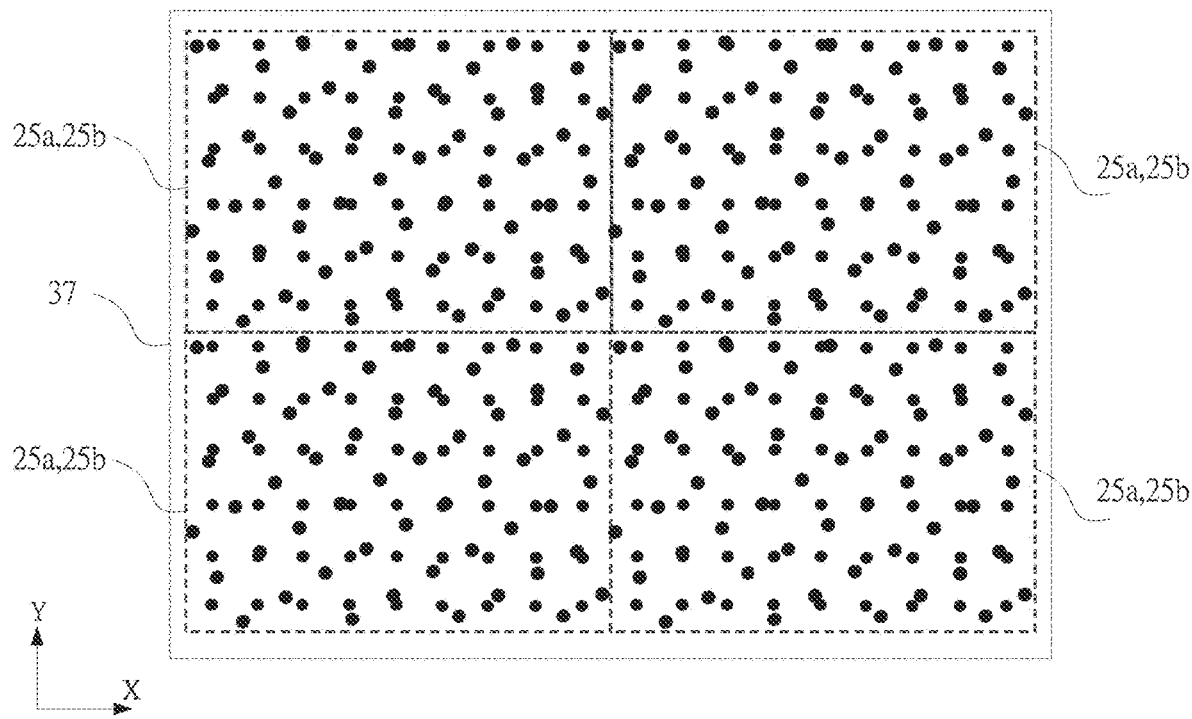
FIG. 21 is a top-view diagram illustrating partial distribution pattern of light dots by a light source with the arrangement pattern of emitting light dots of FIG. 18 for a projector of structured light pattern according to the present invention.

Next, any one of the arranging patterns of emitting light dots or the combination thereof in the present invention may apply to the whole light-emitting side of a light source. FIG. 18 is a front-view diagram illustrating an arranging pattern of emitting light dots of tenth embodiment for a projector of structured light pattern. Referring to FIG. 18, the whole light-emitting side 19 of the light source may divide into two adjacent portions. There are a first arranging pattern of emitting light dots 25a on a first portion and a second arranging pattern of emitting light dots 25b on a second portion. With being imaged by a lens element and duplicated by a diffractive optical element, the plural arranging patterns of emitting light dots are generated and partially overlapped. In one example, the shape and size of the first arranging pattern of emitting light dots 25a on the first portion are same as the ones of the second arranging pattern of emitting light dots 25b on the second portion. The diffractive optical element may tightly piece the plural first or second portions together to form a combined pattern. For example, plural first arranging patterns of emitting light dots 25a are adjacently close together like a jigsaw to form a distribution pattern of light dots 27a shown in FIG. 19, and plural second patterns of emitting light dots 25b are adjacently close together like another jigsaw to form a distribution pattern of light dots 27b shown in FIG. 20. The two combined patterns are overlapped to form a complex combined pattern like a larger distribution pattern of light dots 37 shown in FIG. 21. It is understood that the distribution pattern of light dots 37 is formed by overlapping the distribution pattern of light dots 27a and the distribution pattern of light dots 27b to form such a distribution pattern of structured light dots.

Figure 22:
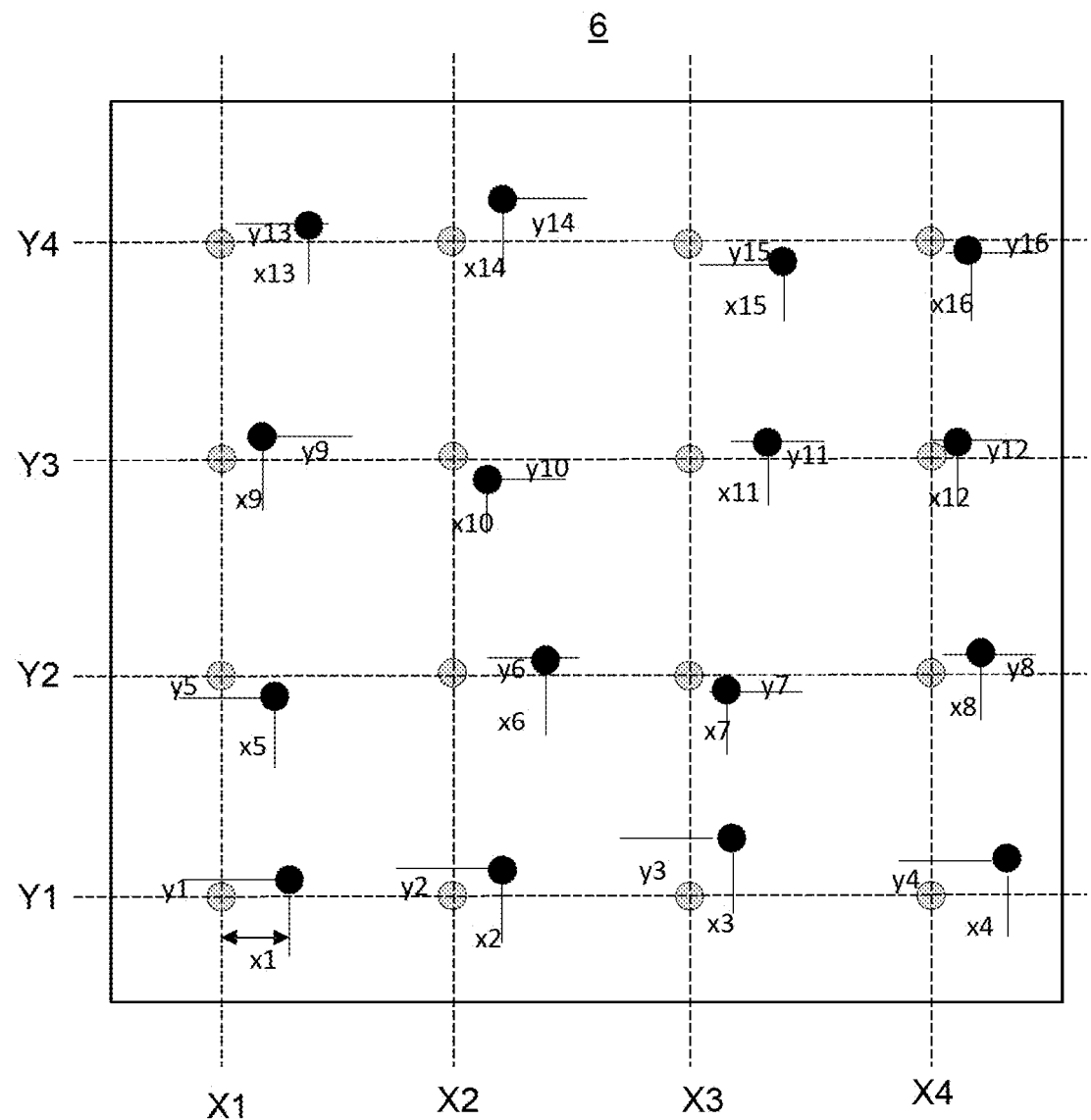
FIG. 22 is a schematically diagram illustrating a design principle of DOE for projector of structured light pattern according to the present invention.

FIG. 22 is a schematically diagram illustrating a design principle of DOE for projector of structured light pattern according to the present invention. To convenient illustrating, a distribution of projecting dots 6 that is formed by a single emitting light beam passing through a DOE to be projected may be illustrated with coordinate axes X1, X2, X3, X4, Y1, Y2, Y3, and Y4. Shown in FIG. 22, it is known that plural light dots radiating from a light source are duplicated by a DOE to be overlapped, with respect to same relative positions, at plural intersections of the coordinate axes X1, X2, X3, X4, Y1, Y2, Y3, and Y4. It is also known that the density of dots at the intersections of the coordinate axes X1, X2, X3, X4, Y1, Y2, Y3, and Y4 represents the size of overlapping of plural patterns. In the present invention, black dots shown in FIG. 26 are deviated from the intersections of the coordinate axes X1, X2, X3, X4, Y1, Y2, Y3, and Y4 to be adjusted to different positions by the projector of structured light pattern of the present invention. Thus, black dots in coordinate value $(x_i, y_i)$ have positions different from ones of the intersections, and there are plural different relative positions when they are imaged and duplicated. Moreover, the distribution pattern of light dots consisted of the black dots may be not regular and not repeated. In one example, at least two adjacent black dots in coordinate value $(x_i, y_i)$ have different positions with respect to two corresponding intersections. Accordingly, range without repeating distribution patterns may increase by the projector of structured light pattern of the present invention.

Accordingly, the projector of structured light pattern of the present invention may generate projecting light dots in high density of distribution that meets requirement of depth estimation. Plural emitting light dots of a light source are arranged to represent an arranging pattern of emitting light dots in a specific regularity. The arranging pattern of emitting light dots can be duplicated and imaged to be projected as a distribution pattern of light dots. With the design of DOE, any two adjacent arranging patterns of emitting light dots can be partially overlapped to form an overlapping zone of adjustable sizes. Moreover, with the design of DOE, there are not repeated pattern at one or two dimensions in the distribution pattern of light dots, but it is not limited to in the present invention. For example, in the distribution pattern of light dots to be projected, there may be of a repeatability period larger than a width unit of the arranging pattern of emitting light dots.

The arranging pattern of emitting light dots of the light source aforementioned in the present invention is in the specific regularity. However, in the case that the emitting light dots of the light source are not regularly arranged, their arranging pattern is still imaged and duplicated. In such a situation, any two adjacent duplicated arranging patterns are still partially overlapped to form a distribution pattern of light dots a repeatability period larger than a width unit of the arranging pattern of emitting light dots.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A projector of structured light pattern, comprising:
   a light source of multiple point source comprising plural emitting light dots arranged to form an arranging pattern of emitting light dots in a specific regularity;
   a lens element imaging the arranging pattern of emitting light dots to be projected on a target area; and
   a diffractive optical element duplicating the imaged arranging pattern of emitting light dots into the plural arranging patterns of emitting light dots, wherein any adjacent two of the imaged arranging patterns of emitting light dots are partially overlapped to form an overlapping zone, and by partially overlapping the arranging patterns of emitting light dots in the specific regularity, plural projected light dots within the overlapping zone are in an irregular arrangement.

2. The projector of structured light pattern according to claim 1, wherein the at least two overlapping zones of the plural arranging pattern of emitting light dots have different widths in a horizontal or/and a vertical directions, or the plural overlapping zones of the plural arranging pattern of emitting light dots have different widths in the horizontal or/and the vertical directions.

3. The projector of structured light pattern according to claim 2, wherein the specific regularity is a gradually increasing spacing, a gradually decreasing spacing, an interlacing of gradually increasing and decreasing spacing, or a random way in the horizontal or/and the vertical directions.

4. The projector of structured light pattern according to claim 3, wherein the gradually increasing spacing way or the gradually decreasing spacing way is an arithmetic progression variation.

5. The projector of structured light pattern according to claim 1, wherein the plural emitting light dots are arranged in an arrangement direction with an angle that is between a horizontal direction or a vertical direction and the arrangement direction.

6. The projector of structured light pattern according to claim 1, wherein the plural emitting light dots are arranged in a concentric-circles way to form the arranging pattern of emitting light dots to be a pattern of a concentric-circles distributing dots.

7. The projector of structured light pattern according to claim 1, wherein the arranging pattern of emitting light dots includes at least a first and a second portions in the specific regularity; the plural emitting light dots respectively corresponding to the first and second portions are arranged in two arrangement directions with an angle between them; the diffractive optical element duplicates the first and second portions to respectively form plural close together to respectively form a first and a second combined patterns; and the first and the second combined patterns are overlapped to form a complex combined pattern.

8. The projector of structured light pattern according to claim 7, wherein the specific regularity is a gradually increasing spacing, a gradually decreasing spacing, an interlacing of gradually increasing and decreasing spacing, or a random way in the horizontal or/and the vertical directions.

9. The projector of structured light pattern according to claim 1, wherein the light source of multiple point source is provided with a vertical-cavity surface-emitting laser (VCSEL).

10. A projector of structured light pattern, comprising:
a light source of multiple point source comprising plural emitting light dots arranged to form an arranging pattern of emitting light dots in a specific regularity;
a diffractive optical element positioned in front of the light source of multiple point source to receive plural light beams radiated from the plural emitting light dots, wherein the diffractive optical element images the arranging pattern of emitting light dots and duplicates the imaged arranging pattern of emitting light dots into the plural arranging patterns of emitting light dots, wherein any adjacent two of the imaged arranging patterns of emitting light dots are partially overlapped to form an overlapping zone, and by partially overlapping the arranging patterns of emitting light dots in the specific regularity, plural projected light dots within the overlapping zone are in an irregular arrangement.

11. The projector of structured light pattern according to claim 10, wherein the at least two overlapping zones of the plural arranging pattern of emitting light dots have different widths in a horizontal or/and a vertical directions, or the plural overlapping zones of the plural arranging pattern of emitting light dots have different widths in the horizontal or/and the vertical directions.

12. The projector of structured light pattern according to claim 11, wherein the specific regularity is a gradually increasing spacing, a gradually decreasing spacing, an interlacing of gradually increasing and decreasing spacing, or a random way in the horizontal or/and the vertical directions.

13. The projector of structured light pattern according to claim 10, wherein the plural emitting light dots are arranged in an arrangement direction with an angle that is between a horizontal direction or a vertical direction and the arrangement direction.

14. The projector of structured light pattern according to claim 10, wherein the plural emitting light dots are arranged in a concentric-circles way to form the arranging pattern of emitting light dots to be a pattern of a concentric-circles distributing dots.

15. The projector of structured light pattern according to claim 10, wherein the arranging pattern of emitting light dots includes at least a first and a second portions in the specific regularity; the plural emitting light dots respectively corresponding to the first and second portions are arranged in two arrangement directions with an angle between them; the diffractive optical element duplicates the first and second portions to respectively form plural close together to respectively form a first and a second combined patterns; and the first and the second combined patterns are overlapped to form a complex combined pattern.

16. The projector of structured light pattern according to claim 15, wherein the specific regularity is a gradually increasing spacing, a gradually decreasing spacing, an interlacing of gradually increasing and decreasing spacing, or a random way in the horizontal or/and the vertical directions.

17. The projector of structured light pattern according to claim 10, wherein the light source of multiple point source is provided with a vertical-cavity surface-emitting laser (VCSEL).

* * * * *